United States Patent
Farshchi et al.

(10) Patent No.: US 10,156,009 B2
(45) Date of Patent: Dec. 18, 2018

(54) SILVER COPPER INDIUM GALLIUM SELENIDE REACTIVE SPUTTERING METHOD AND APPARATUS, AND PHOTOVOLTAIC CELL CONTAINING SAME

(71) Applicant: BEIJING APOLLO DING RONG SOLAR TECHNOLOGY CO., LTD., Santa Clara (CN)

(72) Inventors: Rouin Farshchi, Palo Alto, CA (US); Neil Mackie, Fremont, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/403,434

(22) Filed: Jan. 11, 2017

(65) Prior Publication Data
US 2018/0158973 A1    Jun. 7, 2018

Related U.S. Application Data

(60) Provisional application No. 62/430,050, filed on Dec. 5, 2016.

(51) Int. Cl.
| | | |
|---|---|---|
| C23C 14/06 | (2006.01) | |
| C23C 14/00 | (2006.01) | |
| C23C 14/54 | (2006.01) | |
| C23C 14/56 | (2006.01) | |
| H01J 37/34 | (2006.01) | |
| H01L 31/032 | (2006.01) | |

(Continued)

(52) U.S. Cl.
CPC ...... *C23C 14/0623* (2013.01); *C23C 14/0057* (2013.01); *C23C 14/541* (2013.01); *C23C 14/562* (2013.01); *C23C 14/568* (2013.01); *H01L 31/022425* (2013.01); *H01L 31/0324* (2013.01); *H01L 31/18* (2013.01); *H01J 37/3473* (2013.01)

(58) Field of Classification Search
CPC . C23C 14/0057; C23C 14/06; C23C 14/0623; C23C 14/541; C23C 14/562; C23C 14/568; H01J 37/3426; H01J 37/3429; H01J 37/3464; H01J 37/3473; H01L 31/18; H01L 31/0324; H01L 31/022425
See application file for complete search history.

(56) References Cited

U.S. PATENT DOCUMENTS

| | | |
|---|---|---|
| 7,935,558 B1 | 5/2011 | Juliano et al. |
| 8,048,707 B1 | 11/2011 | Shufflebotham et al. |
| 8,134,069 B2 | 3/2012 | Mackie et al. |

(Continued)

OTHER PUBLICATIONS

U.S. Appl. No. 15/153,478, filed May 12, 2016, Mackie et al.

*Primary Examiner* — Michael A Band
(74) *Attorney, Agent, or Firm* — The Marbury Law Group PLLC

(57) ABSTRACT

A method of making a semiconductor structure includes a step of sputtering silver, copper, indium, and gallium on a substrate in an ambient including at least one chalcogen to deposit an alloy of silver, copper, indium, gallium, and at least one chalcogen. A film of the alloy can be deposited on a continuously moving substrate with a high throughput to form a p-type semiconductor absorber layer of a photovoltaic cell.

11 Claims, 5 Drawing Sheets

(51) Int. Cl.
*H01L 31/0224* (2006.01)
*H01L 31/18* (2006.01)

(56) References Cited

U.S. PATENT DOCUMENTS

| | | | |
|---|---|---|---|
| 8,648,253 B1 * | 2/2014 | Woods | H01L 31/0324 |
| | | | 136/243 |
| 8,912,429 B2 | 12/2014 | Wudu et al. | |
| 9,169,548 B1 | 10/2015 | Corson et al. | |
| 9,303,316 B1 | 4/2016 | Shufflebotham et al. | |
| 2009/0169723 A1 | 7/2009 | Hanket et al. | |
| 2010/0258191 A1 * | 10/2010 | Mackie | H01L 21/02425 |
| | | | 136/264 |
| 2014/0102891 A1 | 4/2014 | Hollars et al. | |
| 2014/0162397 A1 * | 6/2014 | Van Duren | H01L 31/0322 |
| | | | 438/95 |

* cited by examiner

US 10,156,009 B2

SILVER COPPER INDIUM GALLIUM SELENIDE REACTIVE SPUTTERING METHOD AND APPARATUS, AND PHOTOVOLTAIC CELL CONTAINING SAME

BACKGROUND

The present disclosure is directed generally to an apparatus and method for manufacturing a photovoltaic cell, and specifically to an apparatus and method for manufacturing a silver copper indium gallium selenide absorber layer by reactive sputtering.

A "thin-film" photovoltaic material refers to a polycrystalline or amorphous photovoltaic material that is deposited as a layer on a substrate that provides structural support. The thin-film photovoltaic materials are distinguished from single crystalline semiconductor materials that have a higher manufacturing cost. Some of the thin-film photovoltaic materials that provide high conversion efficiency include copper-indium-gallium-chalcogenide material, such as copper indium gallium selenide (CIGS).

Thin-film photovoltaic cells (also known as solar cells) may be manufactured using a roll-to-roll coating system based on sputtering, evaporation, or chemical vapor deposition (CVD) techniques. A thin foil substrate, such as a foil web substrate, is fed from a roll in a linear belt-like fashion through the series of individual vacuum chambers or a single divided vacuum chamber where it receives the required layers to form the thin-film photovoltaic cells. In such a system, a foil having a finite length may be supplied on a roll. The end of a new roll may be coupled to the end of a previous roll to provide a continuously fed foil layer.

The processing rate of the roll is determined by the deposition rates of the electrode and semiconductor materials deposited on the foil web substrate. It is well known, however, that performance metrics of the photovoltaic cell, such as efficiency, open circuit voltage, closed circuit current density, and fill factor critically depends on the crystalline quality of the deposited semiconductor material. Generally, semiconductor materials deposited at a low deposition rate provides larger grain sizes and superior performance. Thus, a method for depositing a high quality crystalline material at a high deposition rate is desirable.

SUMMARY

According to an aspect of the present disclosure, a method of making a semiconductor structure is provided, which include a step of sputtering silver, copper, indium, and gallium over a substrate in an ambient including at least one chalcogen. An alloy of silver, copper, indium, gallium, and at least one chalcogen is deposited over the substrate.

According to another aspect of the present disclosure, a reactive sputtering apparatus comprises an enclosure containing at least one chalcogen source configured to provide a chalcogen containing ambient, and at least one silver copper indium gallium alloy sputtering target.

According to yet another aspect of the present disclosure, a photovoltaic cell comprises a first electrode located on a substrate; a p-type compound semiconductor material layer located on the first electrode layer and comprising silver copper indium gallium selenide (ACIGS) film in which a copper plus silver to Group III atomic ratio is lower in a bottom and middle of the ACIGS film than in a top of the ACIGS film; an n-type compound semiconductor material layer located on the p-type compound semiconductor material layer; and a second electrode located on the n-type compound semiconductor material layer.

DETAILED DESCRIPTION

Figure 1:
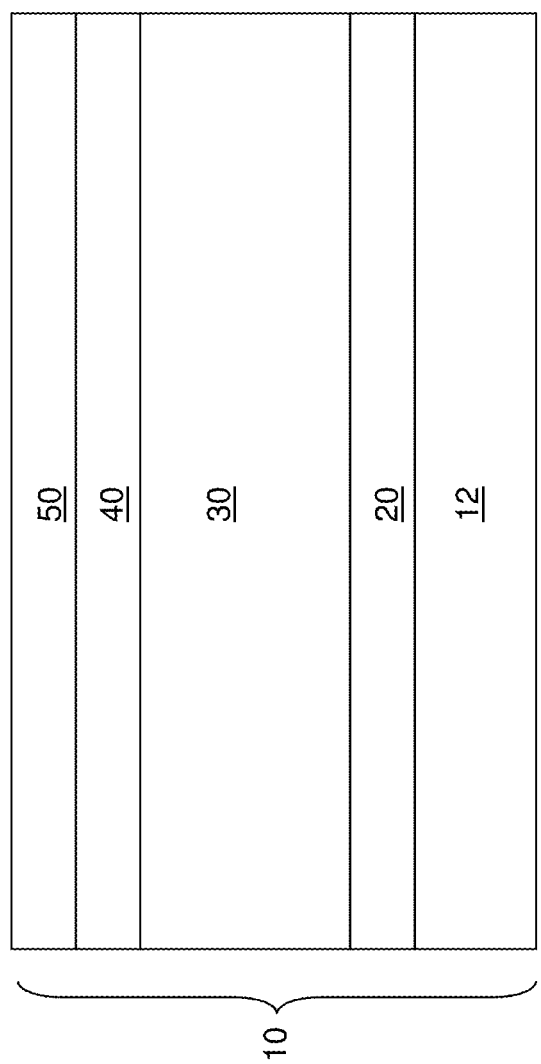
FIG. 1 is a schematic vertical cross sectional view of a thin-film photovoltaic cell the can be manufactured according to an embodiment of the present disclosure.

As discussed above, the present disclosure is directed to an apparatus and method for manufacturing a semiconductor structure including an alloy of silver, copper, indium, gallium, and at least one chalcogen by sputtering in an ambient including a chalcogen, the various aspects of which are described herein. The semiconductor structure can be an absorber layer of a photovoltaic (i.e., solar) cell.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. Same reference numerals to the same element or similar elements. Elements with the same reference numerals are presumed to have the same composition unless described otherwise.

As used herein, a first element located "on" a second element can be located on the exterior side of a surface of the second element or on the interior side of the second element. As used herein, a first element is located "directly on" a second element if there exist a direct physical contact between a surface of the first element and a surface of the second element. As used herein, an element is "configured" to perform a function if the structural components of the element are inherently capable of performing the function due to the physical and/or electrical characteristics thereof.

Without wishing to be bound by a particular theory, the present inventors determined that addition of silver into a sputtering target including copper, indium and gallium lowers a melting temperature of a silver-copper-indium-gallium-chalcogenide layer during reactive sputtering, which enhances crystallization of the deposited silver-copper-indium-gallium-chalcogenide layer to provide larger grains and less deep lattice defects in the deposited layer. This improves the crystalline quality of the deposited silver-copper-indium-gallium-chalcogenide layer, such as a silver-copper-indium-gallium-selenide ("ACIGS") p-type absorber layer of a photovoltaic cell, and improves the performance the photovoltaic cell. Various reactive sputtering methods and apparatus for depositing the ACIGS p-type absorber layer are described below.

Referring to FIG. 1, a vertical cross-sectional view of a photovoltaic cell 10 is illustrated. The photovoltaic cell 10 includes a substrate, such as an electrically conductive substrate 12, a first electrode 20, a p-type compound semiconductor material layer 30, an n-type compound semiconductor material layer 40, a second electrode 50, and an optional antireflective (AR) coating layer (not shown).

The substrate 12 is preferably a flexible, electrically conductive material, such as a metallic foil that is fed into a system of one or more process modules as a web for deposition of additional layers thereupon. For example, the metallic foil of the conductive substrate 12 can be a sheet of a metal or a metallic alloy such as stainless steel, aluminum, or titanium. If the substrate 12 is electrically conductive, then it may comprise a part of the back side (i.e., first) electrode of the cell 10. Thus, the first (back side) electrode of the cell 10 may be designated as (20, 12). Alternatively, the conductive substrate 12 may be an electrically conductive or insulating polymer foil. Still alternatively, the substrate 12 may be a stack of a polymer foil and a metallic foil. In another embodiment, the substrate 12 may be a rigid glass substrate or a flexible glass substrate. The thickness of the substrate 12 can be in a range from 100 microns to 2 mm, although lesser and greater thicknesses can also be employed.

The first or back side electrode 20 may comprise any suitable electrically conductive layer or stack of layers. For example, electrode 20 may include a metal layer, which may be, for example, molybdenum. Alternatively, a stack of molybdenum and sodium and/or oxygen doped molybdenum layers may be used instead, as described in U.S. Pat. No. 8,134,069, which is incorporated herein by reference in its entirety. In another embodiment, the first electrode 20 can include a molybdenum material layer doped with K and/or Na, i.e., $MoK_x$ or $Mo(Na,K)_x$, in which x can be in a range from $1.0 \times 10^{-6}$ to $1.0 \times 10^{-2}$. The electrode 20 can have a thickness in a range from 500 nm to 1 micron, although lesser and greater thicknesses can also be employed.

The p-type compound semiconductor material layer 30 can include a p-type silver copper indium gallium selenide ("ACIGS"), which functions as a semiconductor absorber layer. The thickness of the p-type compound semiconductor material layer 30 can be in a range from 1 microns to 5 microns, although lesser and greater thicknesses can also be employed. The ACIGS p-type compound semiconductor material layer 30 can also contain sodium which diffuses from the first electrode 20 and/or is added into the layer 30 during deposition.

The n-type compound semiconductor material layer 40 includes an n-doped semiconductor material such as CdS, ZnS, ZnSe, or an alternative metal sulfide or a metal selenide. The thickness of the n-type compound semiconductor material layer 40 is typically less than the thickness of the p-type compound semiconductor material layer 30, and can be in a range from 30 nm to 100 nm, although lesser and greater thicknesses can also be employed. The junction between the p-type compound semiconductor material layer 30 and the n-type compound semiconductor material layer 40 is a p-n junction. The n-type compound semiconductor material layer 40 can be a material which is substantially transparent to at least part of the solar radiation. The n-type compound semiconductor material layer 40 is also referred to as a window layer or a buffer layer.

The second (e.g., front side or top) electrode 50 comprises one or more transparent conductive layers 50. The transparent conductive layer 50 is conductive and substantially transparent. The transparent conductive layer 50 can include one or more transparent conductive materials, such as ZnO, indium tin oxide (ITO), Al doped ZnO ("AZO"), Boron doped ZnO ("BZO"), or a combination or stack of higher resistivity AZO and lower resistivity ZnO, ITO, AZO and/or BZO layers. The second electrode 50 contacts an electrically conductive part (e.g., a metal wire or trace) of an interconnect structure (not shown). The interconnect structure may optionally contain one or more insulating sheets, such as optically transparent polymer sheets which support the electrically conductive part. The electrically conductive part electrically connects the first electrode 20 of one photovoltaic cell 10 to the second electrode 50 of an adjacent photovoltaic cell 10 in a photovoltaic panel (i.e., module). The interconnect may comprise the interconnect described in U.S. Pat. No. 8,912,429, issued Dec. 16, 2014, which is incorporated herein by reference in its entirety, or any other suitable interconnect that is used in photovoltaic panels.

Figure 2:
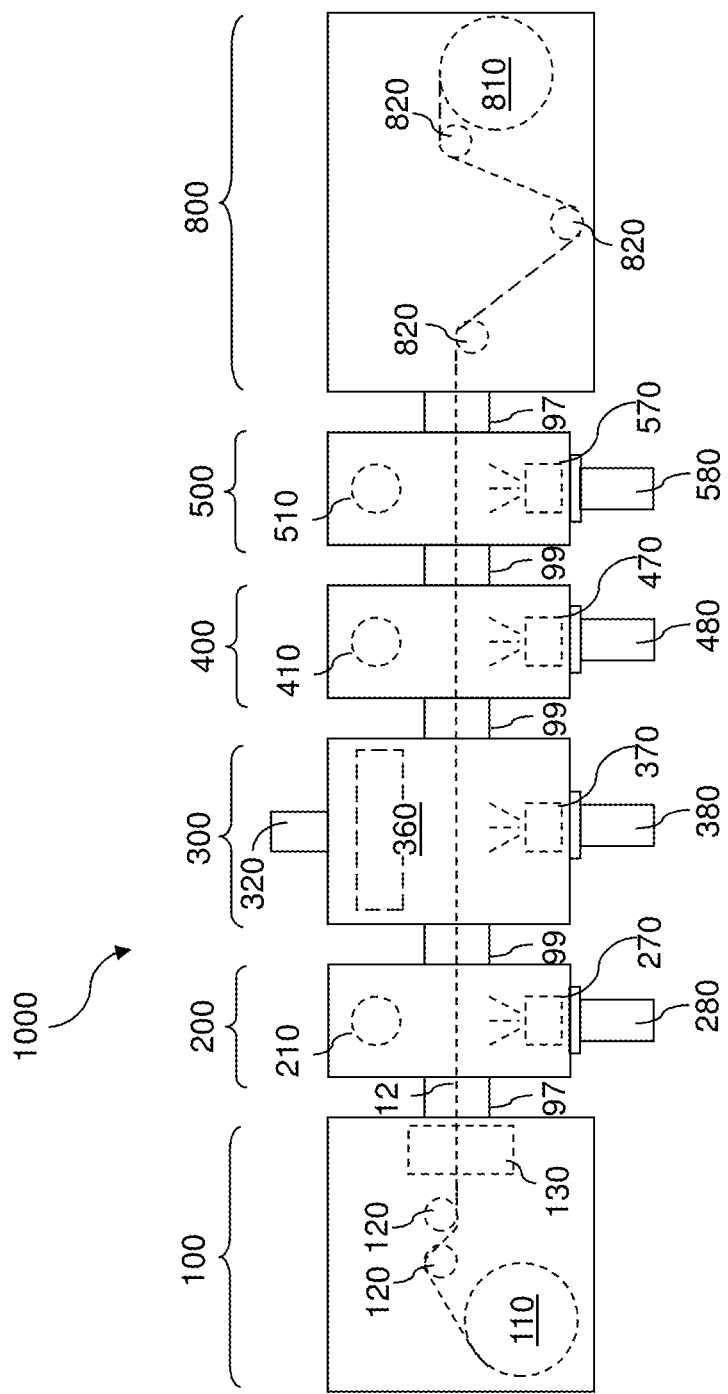
FIG. 2 is a schematic diagram of an exemplary modular deposition apparatus that can be used to manufacture the photovoltaic cell illustrated in FIG. 1 according to an embodiment of the present disclosure.

Referring to FIG. 2, an apparatus 1000 for forming the photovoltaic cell 10 illustrated in FIG. 1 is shown. The apparatus 1000 is an exemplary semiconductor device manufacturing apparatus, which is configured as a modular deposition apparatus. The apparatus 1000 can be used to manufacture the photovoltaic cell illustrated in FIG. 1. The apparatus 1000 includes an input unit 100, a first process module 200, a second process module 300, a third process module 400, a fourth process module 500, and an output unit 800 that are sequentially connected to accommodate a continuous flow of the substrate 12 in the form of a web foil substrate layer through the apparatus. The modules (100, 200, 300, 400, 500) may comprise the modules described in U.S. Pat. No. 9,303,316, issued on Apr. 5, 2016, incorporated herein by reference in its entirety, or any other suitable modules. The first, second, third, and fourth process modules (200, 300, 400, 500) can be under vacuum by first, second, third, and fourth vacuum pumps (280, 380, 480, 580), respectively. The first, second, third, and fourth vacuum pumps (280, 380, 480, 580) can provide a suitable level of respective base pressure for each of the first, second, third, and fourth process modules (200, 300, 400, 500), which may be in a range from $1.0 \times 10^{-9}$ Torr to $1.0 \times 10^{-2}$ Torr, and preferably in range from $1.0 \times 10^{-9}$ Torr to $1.0 \times 10^{-5}$ Torr.

Each neighboring pair of process modules (200, 300, 400, 500) is interconnected employing a vacuum connection unit 99, which can include a vacuum tube and an optional slit valve that enables isolation while the substrate 12 is not present. The input unit 100 can be connected to the first process module 200 employing a sealing connection unit 97. The last process module, such as the fourth process module 500, can be connected to the output unit 800 employing another sealing connection unit 97.

The substrate 12 can be a metallic or polymer web foil that is fed into a system of process modules (200, 300, 400, 500) as a web for deposition of material layers thereupon to form the photovoltaic cell 10. The substrate 12 can be fed from an entry side (i.e., at the input module 100), continuously move through the apparatus 1000 without stopping, and exit the apparatus 1000 at an exit side (i.e., at the output module 800). The substrate 12, in the form of a web, can be provided on an input spool 110 provided in the input module 100. Each of the process modules (200, 300, 400, 500) is configured to continuously feed the substrate 12 into a respective enclosure thereof through an entry opening (which may be located at the sealing connection unit 97 before the first process module 200 or at a vacuum connection unit 99) and to continuously extract the substrate 12 from the respective enclosure through an exit opening (which may be located at a vacuum connection unit 99 or at the sealing connection unit 97 after the fourth process module 500).

The substrate 12, as embodied as a metal or polymer web foil, is moved throughout the apparatus 1000 by input-side rollers 120, output-side rollers 820, and additional rollers (not shown) in the process modules (200, 300, 400, 500), vacuum connection units 99, or sealing connection units 97, or other devices. Additional guide rollers may be used. Some rollers (120, 820) may be bowed to spread the web (i.e., the substrate 12), some may move to provide web steering, some may provide web tension feedback to servo controllers, and others may be mere idlers to run the web in desired positions.

The input module 100 can be configured to allow continuous feeding of the substrate 12 by adjoining multiple foils by welding, stapling, or other suitable means. Rolls of substrates 12 can be provided on multiple input spools 110. A joinder device 130 can be provided to adjoin an end of each roll of the substrate 12 to a beginning of the next roll of the substrate 12. In one embodiment, the joinder device 130 can be a welder or a stapler. An accumulator device (not shown) may be employed to provide continuous feeding of the substrate 12 into the apparatus 1000 while the joinder device 130 adjoins two rolls of the substrate 12.

In one embodiment, the input module 100 may perform pre-processing steps. For example, a pre-clean process may be performed on the substrate 12 in the input module 100. In one embodiment, the substrate 12 may pass by a heater element array (not shown) that is configured to provide at least enough heat to remove water adsorbed on the surface of the substrate 12. In one embodiment, the substrate 12 can pass over a roller configured as a cylindrical rotary magnetron. In this case, the front surface of substrate 12 can be continuously cleaned by DC, AC, or RF sputtering as the substrate 12 passes around the roller/magnetron. The sputtered material from the substrate 12 can be captured on a disposable shield. Optionally, another roller/magnetron may be employed to clean the back surface of the substrate 12. In one embodiment, the sputter cleaning of the front and/or back surface of the substrate 12 can be performed with linear ion guns instead of magnetrons. Alternatively or additionally, a cleaning process can be performed prior to loading the roll of the substrate 12 into the input module 100. In one embodiment, a corona glow discharge treatment may be performed in the input module 100 without introducing an electrical bias.

The output module 800 can include an output spool 810, which winds the web embodying the photovoltaic cell 10. The photovoltaic cell 10 is the combination of the substrate 12 and the deposited layers (20, 30, 40, 50) thereupon.

In one embodiment, the substrate 12 may be oriented in one direction in the input module 100 and/or in the output module 800, and in a different direction in the process modules (200, 300, 400, 500). For example, the substrate 12 can be oriented generally horizontally in the input module 100 and the output module 800, and generally vertically in the process module(s) (200, 300, 400, 500). A turning roller or turn bar (not shown) may be provided to change the orientation of the substrate 12, such as between the input module 100 and the first process module 200. In an illustrative example, the turning roller or the turn bar in the input module can be configured to turn the web substrate 12 from an initial horizontal orientation to a vertical orientation. Another turning roller or turn bar (not shown) may be provided to change the orientation of the substrate 12, such as between the last process module (such as the fourth process module 500) and the output module 800. In an illustrative example, the turning roller or the turn bar in the input module can be configured to turn the web substrate 12 from the vertical orientation employed during processing in the process modules (200, 300, 400, 500) to a horizontal orientation.

The input spool 110 and optional output spool 810 may be actively driven and controlled by feedback signals to keep the substrate 12 in constant tension throughout the apparatus 1000. In one embodiment, the input module 100 and the output module 800 can be maintained in the air ambient at all times while the process modules (200, 300, 400, 500) are maintained at vacuum during layer deposition.

Each of the first, second, third, and fourth process modules (200, 300, 400, 500) can deposit a respective material layer to form the photovoltaic cell 10 (shown in FIG. 1) as the substrate 12 passes through the first, second, third, and fourth process modules (200, 300, 400, 500) sequentially.

Optionally, one or more additional process modules (not shown) may be added between the input module 100 and the first process module 200 to sputter a back side protective layer on the back side of the substrate 12 before deposition of the first electrode 20 in the first process module 200. Further, one or more barrier layers may be sputtered over the front surface of the substrate 12 prior to deposition of the first electrode 20. Alternatively or additionally, one or more process modules (not shown) may be added between the first process module 200 and the second process module 300 to sputter one or more adhesion layers between the first electrode 20 and the p-type compound semiconductor material layer 30 including a silver-copper-indium-gallium-chalcogenide material.

The first process module 200 includes at least one metal sputtering target 210, which includes the material of the first electrode 20 in the photovoltaic cell 10 illustrated in FIG. 1. A first heater element 270 can be provided to heat the web substrate 12 to an optimal temperature for deposition of the first electrode 20. In one embodiment, a plurality of first sputtering targets 210 and a plurality of first heater elements 270 may be employed in the first process module 200. In one embodiment, the at least one metal sputtering target 210 can be mounted on dual cylindrical rotary magnetron(s), or planar magnetron(s) sputtering sources, or RF sputtering sources. In one embodiment, at least one metal sputtering target 210 can include a molybdenum target, a molybdenum-sodium, and/or a molybdenum-sodium-oxygen target, as described in U.S. Pat. No. 8,134,069, incorporated herein by reference in its entirety.

Figure 3:
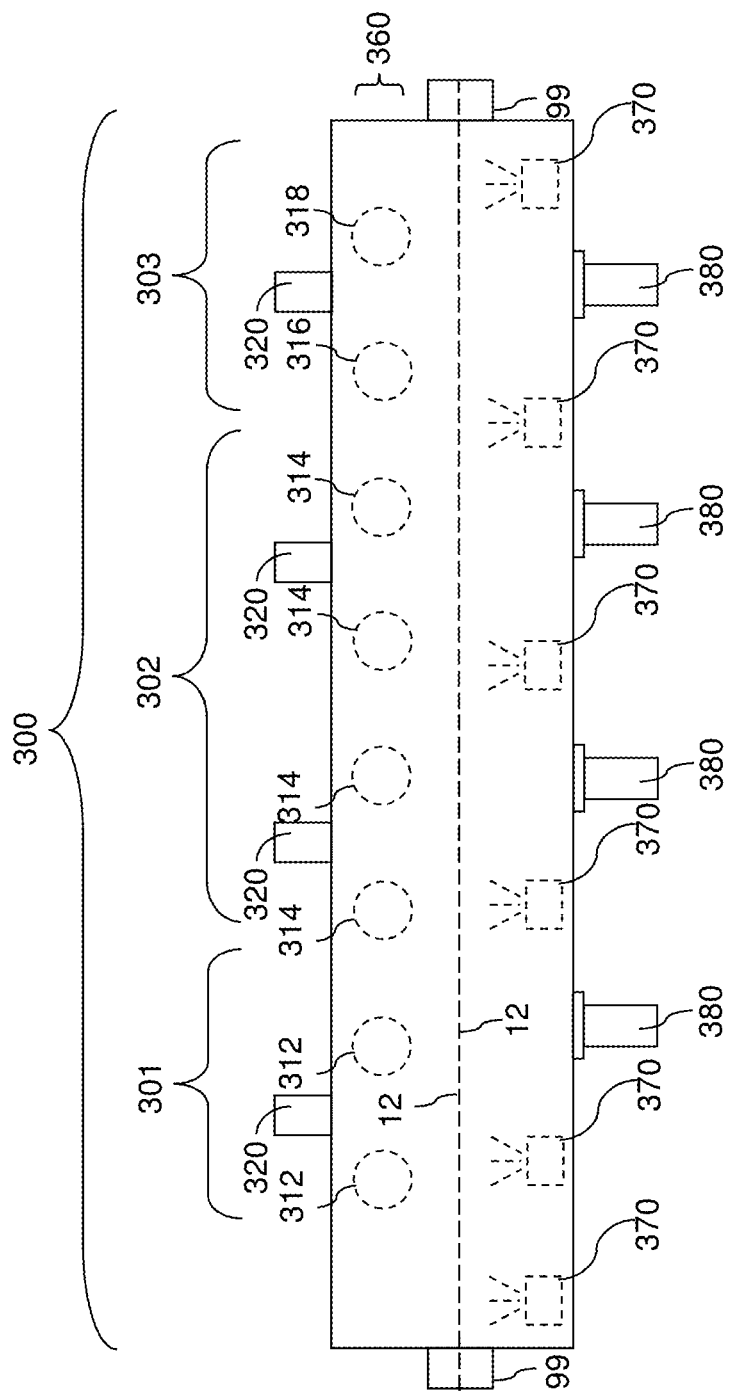
FIG. 3 is a schematic diagram of an exemplary silver-copper-indium-gallium chalcogenide deposition module of the exemplary modular deposition apparatus of FIG. 2 according to an embodiment of the present disclosure.

Referring to FIGS. 2 and 3, the portion of the substrate 12 on which the first electrode 20 is deposited is moved into the second process module 300. The second process module 300 includes in an enclosed chamber, i.e., in an enclosure. At least one sputtering unit that can simultaneously sputter silver, copper, indium, and gallium is provided within the enclosure of the second process module 300. At least one additional sputtering unit that can simultaneously sputter copper, indium, and gallium may be provided within the enclosure of the second process module 300. The substrate 12 is continuously fed into the enclosed chamber, and is continuously extracted out of the enclosed chamber.

A p-type silver-copper-indium-gallium-chalcogenide material is deposited to form the p-type compound semiconductor material layer 30. In one embodiment, the p-type silver-copper-indium-gallium-chalcogenide material can be deposited employing reactive alternating current (AC) magnetron sputtering in a sputtering atmosphere that includes argon and a chalcogen-containing gas at a reduced pressure. In one embodiment, multiple sputtering targets 360 can be employed, each of which includes a respective metallic component target including a respective set of metallic components of the p-type silver-copper-indium-gallium-chalcogenide material can be provided in the second process module 300.

As used herein, the "metallic components" of a silver-copper-indium-gallium-chalcogenide material refers to the non-chalcogenide components of the silver-copper-indium-gallium-chalcogenide material, i.e., silver, copper, indium, and gallium. The metallic component targets of the sputtering targets 360 can include alloys of at least two non-metallic materials in the silver-copper-indium-gallium-chalcogenide material to be deposited. More than two types of targets may be used. For example, some metallic component targets can include an alloy of copper, indium, and gallium, and additional metallic component targets can include an alloy of silver, copper, indium, and gallium, as will be described below with regard to FIG. 3.

The enclosure of the second process module 300 can be configured with at least one source for providing an ambient including at least one chalcogen, such as a chalcogen-containing gas (e.g., Se, S or S and Se containing gas) therein. Specifically, at least one chalcogen-containing gas source 320, such as a selenium evaporator can be provided on the second process module 300 to provide a chalcogen-containing gas into the second process module 300. The chalcogen-containing gas provides chalcogen atoms (e.g., Se atoms) that are incorporated into the deposited silver-copper-indium-gallium-chalcogenide material. In one embodiment, multiple instances of the chalcogen-containing gas source 320 can be provided on the second process module 300.

The second process module 300 can be provided with multiple sets of silver-copper-indium-gallium-chalcogenide material deposition units. As many silver-copper-indium-gallium-chalcogenide material deposition units can be provided along the path of the substrate 12 as is needed to achieve the desired thickness for the p-type silver-copper-indium-gallium-chalcogenide material. The number of second vacuum pumps 380 may, or may not, coincide with the number of the deposition units. The number of second heater elements 370 may, or may not, be commensurate with the number of the deposition units.

The chalcogen-containing gas source 320 includes a source material for the chalcogen-containing gas. For example, if a silver-copper-indium-gallium-selenide (ACIGS) material is to be deposited for the p-type compound semiconductor material layer 30, the chalcogen-containing gas may be selected, for example, from hydrogen selenide ($H_2Se$) and selenium vapor. In case the chalcogen-containing gas is hydrogen selenide, the chalcogen-containing gas source 320 can be a cylinder of hydrogen selenide. In case the chalcogen-containing gas is selenium vapor, the chalcogen-containing gas source 320 can be an effusion cell that can be heated to generate selenium vapor. Alternatively, a sulfide or sulfide-selenide material can be deposited from a sulfur or sulfur and selenium sources.

The second heater elements 370 can include at least one radiation heater element. The second heater elements 370 maintain the temperature of the web substrate 12 at a target deposition temperature. A temperature control system including at least one temperature sensor can be connected to the second heater elements 370 so that the temperature of the substrate 12 can be maintained in a range from 550 degrees Celsius to 900 degrees Celsius during deposition of the alloy of silver, copper, indium, gallium, and the at least one chalcogen on the substrate 12. For example, the temperature of the substrate 12 may be in a range from 600 degrees to 800 degrees, such as from 700 degrees to 740 degrees, during deposition of the alloy of silver, copper, indium, gallium, and at the at least one chalcogen.

The chalcogen incorporation during deposition of the silver-copper-indium-gallium-chalcogenide material determines the properties and quality of the silver-copper-indium-gallium-chalcogenide material in the p-type compound semiconductor material layer 30. When the chalcogen-containing gas is supplied in the gas phase at an elevated temperature, the chalcogen atoms from the chalcogen-containing gas can be incorporated into the deposited film by absorption and subsequent bulk diffusion. This process is referred to as chalcogenization, in which complex interactions occur to form the silver-copper-indium-gallium-chalcogenide material. The p-type doping in the p-type compound semiconductor material layer 30 is induced by controlling the degree of deficiency of the amount of chalcogen atoms with respect to the amount of non-chalcogen atoms (such as silver atoms, copper atoms, indium atoms, and gallium atoms in the case of a ACIGS material) deposited from the metallic component targets of the sputtering targets 360.

Each sputtering target 360 can include a respective metallic component target and a respective magnetron (not expressly shown). Each sputtering target 360 can sputter a silver-copper-indium-gallium alloy or a copper-indium-gallium alloy. In one embodiment, the composition of the sputtered material from the metallic component targets can be gradually changed along the path of the substrate 12 so that a graded silver-copper-indium-gallium-chalcogenide material can be deposited in the second process module 300, as will be described in more detail with respect to FIG. 5 below. In one embodiment, the total number of sputtering targets 360 may be in a range from 3 to 20.

The second process module 300 can include multiple sputtering regions that can be employed to sputter different metallic alloys. In an exemplary configuration, the second process module 300 can include an optional first copper-indium-gallium alloy sputtering zone 301, a silver-copper-indium-gallium alloy sputtering zone 302, and an optional second copper-indium-gallium alloy sputtering zone 303. As optional zones, each of the optional first copper-indium-gallium alloy sputtering zone 301 and the optional second copper-indium-gallium alloy sputtering zone 303 may, or may not, be present.

In one embodiment, zone 302 can be separated from adjacent zones 301 and 303 by partitions, such as walls, in the second process module 300. Alternatively, zone 302 can be separated from adjacent zones 301 and 303 by distance rather than by a physical partition. In one embodiment, the sputtering targets in zones 301 and 303 may comprise copper-indium-gallium targets which lack silver, and the sputtering targets in zone 302 may comprise silver-copper-indium-gallium targets.

The sputtering targets 360 can include at least one first sputtering target 312 located within the first copper-indium-gallium alloy sputtering zone 301 (in case the first copper-indium-gallium alloy sputtering zone 301 is present), at least one second sputtering target 314 located with the silver-copper-indium-gallium alloy sputtering zone 302, and at least one third sputtering target (316, 318) located within the second copper-indium-gallium alloy sputtering zone 303.

Each of the at least one first sputtering target 312 can include one or more respective copper-indium-gallium alloy targets (e.g., 2 to 4 CIG alloy targets), and can be positioned at a respective location that is more proximal to the entry opening of the enclosure of the second process module 300 than the at least one second sputtering target 314. In one embodiment, the ratio of atomic concentration of copper atoms to the sum of atomic concentration of indium atoms and atomic concentration of gallium atoms can be in a range from 0.5 to 1.0, such as from 0.65 to 0.90, in each of the at least one copper-indium-gallium alloy target of the at least one first sputtering target 312. The ratio of the atomic concentration of gallium atoms to the sum of atomic concentration of indium atoms and the atomic concentration of gallium atoms can be in a range from 0.50 to 0.90, such as from 0.60 to 0.80, in each of the at least one copper-indium-gallium alloy target of the at least one first sputtering target 312.

The at least one first sputtering target 312 can simultaneously sputter copper, indium, and gallium on the substrate 12 in the ambient including the at least one chalcogen-containing gas (such as selenium vapor). An alloy of copper, indium, gallium, and the at least one chalcogen (e.g., selenium), such as a CIGS alloy, is deposited on the substrate 12. The ratio of a total flux of copper atoms that impinge on the substrate 12 to the total flux of indium atoms and gallium atoms that impinge on the substrate 12 during the step of simultaneously sputtering copper, indium, and gallium is determined by the composition of the at least one copper-indium-gallium alloy target of the at least one first sputtering target 312, and can be in a range from 0.5 to 1.0, such as from 0.65 to 0.90. The ratio of the total flux of gallium atoms that impinge on the substrate 12 to the total flux of indium atoms and gallium atoms that impinge on the substrate 12 during the step of simultaneously sputtering copper, indium, and gallium is determined by the composition of the at least one copper-indium-gallium alloy target of the at least one first sputtering target 312, and can be in a range from 0.50 to 0.90, such as from 0.60 to 0.90.

In one embodiment, the composition of the at least one copper-indium-gallium alloy target of the at least one first sputtering target 312 is selected such that the deposited copper-indium-gallium-chalcogenide material is maintained in a solid state. For example, the copper to Group III (i.e., copper to indium plus gallium) ratio is preferably 0.97 or less in the at least one first sputtering target 312 and the at least one first sputtering target 312 preferably lacks silver. The relatively low copper content and lack of silver in the at least one first sputtering target 312 forms a solid CIGS layer over the substrate 12 by reactive sputtering in a selenium ambient when the substrate 12 is maintained at 700 to 740° C. during CIGS deposition. In one embodiment, the thickness of the copper-indium-gallium-chalcogenide material deposited by the at least one first sputtering target 312 can be in a range from 200 nm to 3,000 nm, although lesser and greater thicknesses can also be employed.

Each of the at least one second sputtering target 314 can include at least one (e.g., 2 to 8, such as 4 to 6) respective aluminum-copper-indium-gallium alloy targets, and can be positioned at a respective location that is farther from the entry opening of the enclosure of the second process module 300 than the at least one first sputtering target 312. The at least one second sputtering target 314 includes at least one sputtering target configured to simultaneously sputter silver, copper, indium, and gallium on the substrate 12. An alloy of silver, copper, indium, gallium, and at least one chalcogen (e.g., Se), such as the ACIGS alloy, is deposited on the copper-indium-gallium-chalcogenide film on the substrate 12. The alloy of silver, copper, indium, gallium, and the at least one chalcogen (such as a silver-indium-gallium selenide material) is deposited under the chalcogen-containing ambient inside the enclosure, which can include at least one chalcogen-containing gas (such as selenium vapor). Each of at least one second sputtering target 314 can comprise a respective silver-copper-indium-gallium alloy target in which the ratio of atomic fraction of silver atoms to the sum of the atomic fraction of silver atoms and atomic concentration of copper atoms is in a range from 0.05 to 0.5, such as from 0.1 to 0.4 and/or from 0.2 to 0.3.

In one embodiment, the ratio of atomic fraction of silver atoms to the sum of the atomic fraction of silver atoms and atomic concentration of copper atoms in each silver-copper-indium-gallium alloy target can be determined based on the ratio of the thickness of the material deposited by the at least one second sputtering target 314 to the total thickness of the materials to be deposited by the first, second, and third sputtering targets (312, 314, 316). Specifically, the ratio of atomic fraction of silver atoms to the sum of the atomic fraction of silver atoms and atomic concentration of copper atoms in each silver-copper-indium-gallium alloy target can be in a range from 0.05 to 0.5, and the total concentration of silver in the p-type compound semiconductor material layer 30 can range from 2.5 atomic % to 12.5 atomic %, such as from 4 atomic % to 8 atomic %.

In one embodiment, the ratio of the sum of the atomic fraction of silver atoms and the atomic concentration of copper atoms to the sum of atomic concentration of indium atoms and atomic concentration of gallium atoms can be in a range from 0.97 to 1.15, such as from 0.98 to 1.10 and/or from 0.98 to 1.05, in each of the silver-copper-indium-gallium alloy second sputtering targets 314. The ratio of the atomic concentration of gallium atoms to the sum of atomic concentration of indium atoms and the atomic concentration of gallium atoms can be in a range from 0.2 to 0.5, such as from 0.25 to 0.45 and/or from 0.3 to 0.4, in each of the at least one silver-copper-indium-gallium alloy target of the at least one second sputtering target 314.

The at least one second sputtering target 314 can simultaneously sputter silver, copper, indium, and gallium over the substrate 12 in the ambient including the at least one chalcogen (e.g., a chalcogen-containing gas, such as selenium vapor). An alloy of silver, copper, indium, gallium, and the at least one chalcogen is deposited over the substrate 12. The ratio of a total flux of silver atoms that impinge on the substrate 12 to the total flux of silver atoms and copper atoms that impinge on the substrate 12 during the step of simultaneously sputtering silver, copper, indium, and gallium is determined by the composition of the at least one silver-copper-indium-gallium alloy target of the at least one second sputtering target 312, and can be in a range from 0.05 to 0.5, such as from 0.1 to 0.4 and/or from 0.2 to 0.3. The ratio of a total flux of silver atoms and copper atoms that impinge on the substrate 12 to the total flux of indium atoms and gallium atoms that impinge on the substrate 12 during the step of simultaneously sputtering copper, indium, and gallium is determined by the composition of the at least one silver-copper-indium-gallium alloy target of the at least one second sputtering target 314, and can be in a range from 0.97 to 1.15, such as from 0.98 to 1.10 and/or 0.98 to 1.05. The ratio of the total flux of gallium atoms that impinge on the substrate 12 to the total flux of indium atoms and gallium atoms that impinge on the substrate 12 during the step of simultaneously sputtering copper, indium, and gallium is determined by the composition of the at least one silver-copper-indium-gallium alloy target of the at least one second sputtering target 314, and can be in a range from 0.2 to 0.5, such as from 0.25 to 0.45 and/or from 0.3 to 0.4.

In one embodiment, the thickness of the silver-copper-indium-gallium-chalcogenide deposited by the at least one second sputtering target 314 can be in a range from 200 nm to 3,000 nm, although lesser and greater thicknesses can also be employed. The processing step of simultaneously sputtering silver, copper, indium, and gallium employing at least one alloy target including silver, copper, indium, and gallium can be performed while the substrate 12 is at an elevated temperature in a range from 550 degrees Celsius to 900 degrees Celsius. In one embodiment, the temperature of the substrate 12 may be in a range from 600 degrees to 800 degrees, such as 700 degrees and higher, such as from 700 degrees to 740 degrees, during deposition of the alloy of silver, copper, indium, gallium, and at the at least one chalcogen such as a silver-copper-gallium-indium selenide material. In one embodiment, the alloy of silver, copper, indium, gallium, and at least one chalcogen may be deposited at a deposition rate in a range from 200 nm per minute to 1 micron per minute.

In one embodiment, the composition of the at least one silver-copper-indium-gallium alloy target of the at least one second sputtering target 314 is selected such that the silver-copper-indium-gallium-chalcogenide material deposited over the substrate 12 is maintained in a semi-solid state (e.g., a thixotropic state) containing solid and liquid phases. Without wishing to be bound by any particular theory, it is believed that for a high silver plus copper to Group III atomic ratio (e.g., an (Ag+Cu) to (In+Ga) ratio of about 1, such as 0.98 to 1.1), the material deposited over the substrate by reactive sputtering in a chalcogen containing ambient (such as a selenium containing ambient) at a substrate temperature above 700° C. forms a liquid copper selenide or silver-copper selenide phase and a solid CIGS or ACIGS phase. The addition of silver is believed to lower the temperature at which the liquid phase forms and/or to increase the diffusion in the deposited material. The liquid phase functions similar to a flux, and forms a matrix around regions of the solid phase. The liquid phase promotes interdiffusion in the deposited material which results in larger, vertical grains after the material is completely recrystallized in zone 303. Specifically, it is believed that the liquid phase permeates similar to a wave through the grain boundaries of the of the solid CIGS material deposited in zone 301 and coalesces the smaller grains into larger grains while reducing the number of lattice defects which form deleterious deep (i.e., mid-band gap) traps. Silver atoms from the at least one second sputtering target 314 diffuse into the underlying material layer, i.e., the CIGS material deposited by the at least one first sputtering target 312 and the chacogen-containing ambient. Thus, the surface composition of the growth surface during deposition of the silver-copper-indium-gallium chalcogenide material by the at least one second sputtering target 314 and the chalcogen-containing ambient can have a different atomic ratios among silver atoms, copper atoms, indium atoms, and gallium atoms than the at least one second sputtering target 314.

Referring back to FIGS. 2 and 3, each of the at least one third sputtering target (316, 318) in the third zone 303 can include a respective copper-indium-gallium alloy target, and can be positioned at a respective location that is more proximal to the exit opening of the enclosure of the second process module 300 than the at least one second sputtering target 314. In one embodiment, the ratio of atomic concentration of copper atoms to the sum of atomic concentration of indium atoms and atomic concentration of gallium atoms can be in a range from 0.1 to 0.97. In one embodiment, each of the at least one third sputtering target (316, 318) can be silver free (i.e., without intentionally added silver) and include only copper, indium and gallium.

In an illustrative example, the at least one third sputtering target (316, 318) can include a first-type third sputtering target 316 including a first-type copper-indium-gallium alloy target and located in proximity to the at least one second sputtering target 314, and a second-type third sputtering target 318 including a second-type copper-indium-gallium alloy target and located in proximity to the exit opening of the enclosure of the second process module 300. In this case, the ratio of atomic concentration of copper atoms to the sum of atomic concentration of indium atoms and atomic concentration of gallium atoms in the first-type copper-indium-gallium alloy target 316 can be in a range from 0.8 to 0.97, such as 0.9 to 0.96, and the ratio of atomic concentration of copper atoms to the sum of atomic concentration of indium atoms and atomic concentration of gallium atoms in the second-type copper-indium-gallium alloy target 318 can be in a range from 0.1 to 0.4.

The ratio of the atomic concentration of gallium atoms to the sum of atomic concentration of indium atoms and the atomic concentration of gallium atoms can be in a range from 0.2 to 0.6, such as from 0.3 to 0.5, in each of the at least one copper-indium-gallium alloy target of the at least one third sputtering target (316, 318). In case the at least one third sputtering target (316, 318) includes a first-type third sputtering target 316 and a second-type third sputtering target 318, the ratio of the atomic concentration of gallium atoms to the sum of atomic concentration of indium atoms and the atomic concentration of gallium atoms may be the same, or may be different, across the copper-indium-gallium alloy targets of the first-type third sputtering target 316 and the second-type third sputtering target 318. Thus, the targets 316 and 318 preferably have the same gallium to Group III ratio, but a different copper to Group III ratio, in which target 316 has a higher copper to Group III ratio than target 318.

The at least one third sputtering target (316, 318) can simultaneously sputter copper, indium, and gallium on the substrate 12 in the ambient including the at least one chalcogen-containing gas (such as selenium vapor). An alloy of copper, indium, gallium, and the at least one chalcogen is deposited over the previously deposited alloy of silver, copper, indium, gallium, and the at least one chalcogen formed by the at least one second sputtering target 314. Silver atoms diffuse to the growth surface as the deposition process progresses to form alloy of silver, copper, indium, gallium, and the at least one chalcogen (e.g., ACIGS).

Without wishing to be bound by a particular theory, it is believed that the low copper to Group III ratio material sputtered from the second-type third sputtering target 318 deposits an indium rich CIGS material. Specifically, the copper to Group III and gallium to Group III ratios are preferably each less than 0.5 in the indium rich CIGS material. The indium rich CIGS material is in the solid state at the deposition temperature and is believed to cause the copper selenide or silver copper selenide liquid phase in the underlying semi-solid film to recrystallize into the solid state. It is believed that the recrystallization causes the grains in the ACIGS material to become coalesced, larger in size and elongated in the vertical direction with grain boundaries extending preferentially in a direction perpendicular to the thickness of the ACIGS film. The copper selenide or silver copper selenide phase is believed to be incorporated into the ACIGS solid phase during recrystallization.

Referring back to FIGS. 2 and 3, the ratio of a total flux of copper atoms that impinge on the substrate 12 to the total flux of indium atoms and gallium atoms that impinge on the substrate 12 during the step of simultaneously sputtering copper, indium, and gallium is determined by the composition of the at least one copper-indium-gallium alloy target of the at least one third sputtering target (316, 318), and can be in a range from 0.1 to 1.0.

In an illustrative example, the at least one third sputtering target (316, 318) can include a first-type third sputtering target 316 including a first-type copper-indium-gallium alloy target and located in proximity to the at least one second sputtering target 314, and a second-type third sputtering target 318 including a second-type copper-indium-gallium alloy target and located in proximity to the exit opening of the enclosure of the second process module 300. In this case, the ratio of a total flux of copper atoms that impinge on the substrate 12 to the total flux of indium atoms and gallium atoms that impinge on the substrate 12 sputtered from the first-type copper-indium-gallium alloy target can be in a range from 0.8 to 0.97, and the ratio of a total flux of copper atoms that impinge on the substrate 12 to the total flux of indium atoms and gallium atoms that impinge on the substrate 12 sputtered from the second-type copper-indium-gallium alloy target can be in a range from 0.1 to 0.4.

The ratio of the total flux of gallium atoms that impinge on the substrate 12 to the total flux of indium atoms and gallium atoms that impinge on the substrate 12 during the step of simultaneously sputtering copper, indium, and gallium is determined by the composition of the at least one copper-indium-gallium alloy target of the at least one third sputtering target (316, 318), and can be in a range from 0.2 to 0.6, such as from 0.25 to 0.55 and/or from 0.3 to 0.5.

In one embodiment, the thickness of the copper-indium-gallium-chalcogenide material deposited by the at least one third sputtering target (316, 318) can be in a range from 200 nm to 3,000 nm, although lesser and greater thicknesses can also be employed. The total thickness of the p-type compound semiconductor material layer 30 can be in a range from 600 nm to 9,000 nm, such as from 1,500 nm to 5,000 nm, although lesser and greater thicknesses can also be employed. The deposition temperature can be the same throughout deposition of the p-type compound semiconductor material layer 30.

Figure 4:
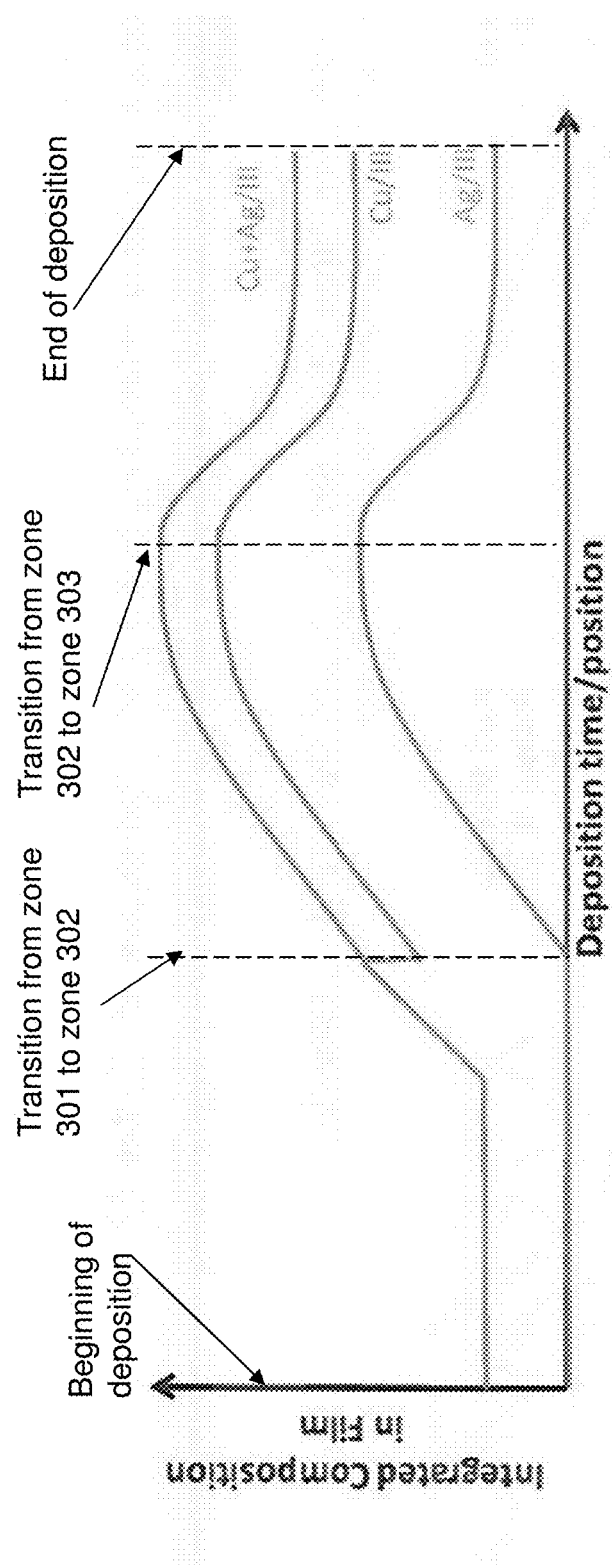
FIG. 4 is a schematic profile of integrated atomic concentration metal elements in the absorber film as a function of deposition time and position according to an exemplary embodiment of the present disclosure.

FIG. 4 schematically illustrates the integrated (i.e., total) composition in the p-type semiconductor material layer 30 (e.g., in the ACIGS film) during deposition as a function of time (i.e., as a function of sequential position in zones 301, 302, 303). As shown in FIG. 4, in zone 301, no silver is preferably incorporated into the film and the atomic ratio of copper to Group III (i.e., In+Ga) elements is constant and then increases. In zone 302, silver is incorporated into the film. The atomic ratio of silver to Group III and the atomic ratio of Group III (i.e., Group 11 which in this case is Cu+Ag) to Group III (i.e., Group IIIA or 13, which in this case is In+Ga) increases in zone 302. The atomic ratio of copper to Group III at first decreases because some copper is substituted with silver, and then increases. In zone 303, the atomic ratios of silver, copper and Group IB to Group III all decrease initially due to the lower copper content in the sputtering targets and absence of silver in the targets until they reach relatively steady state.

Figure 5:
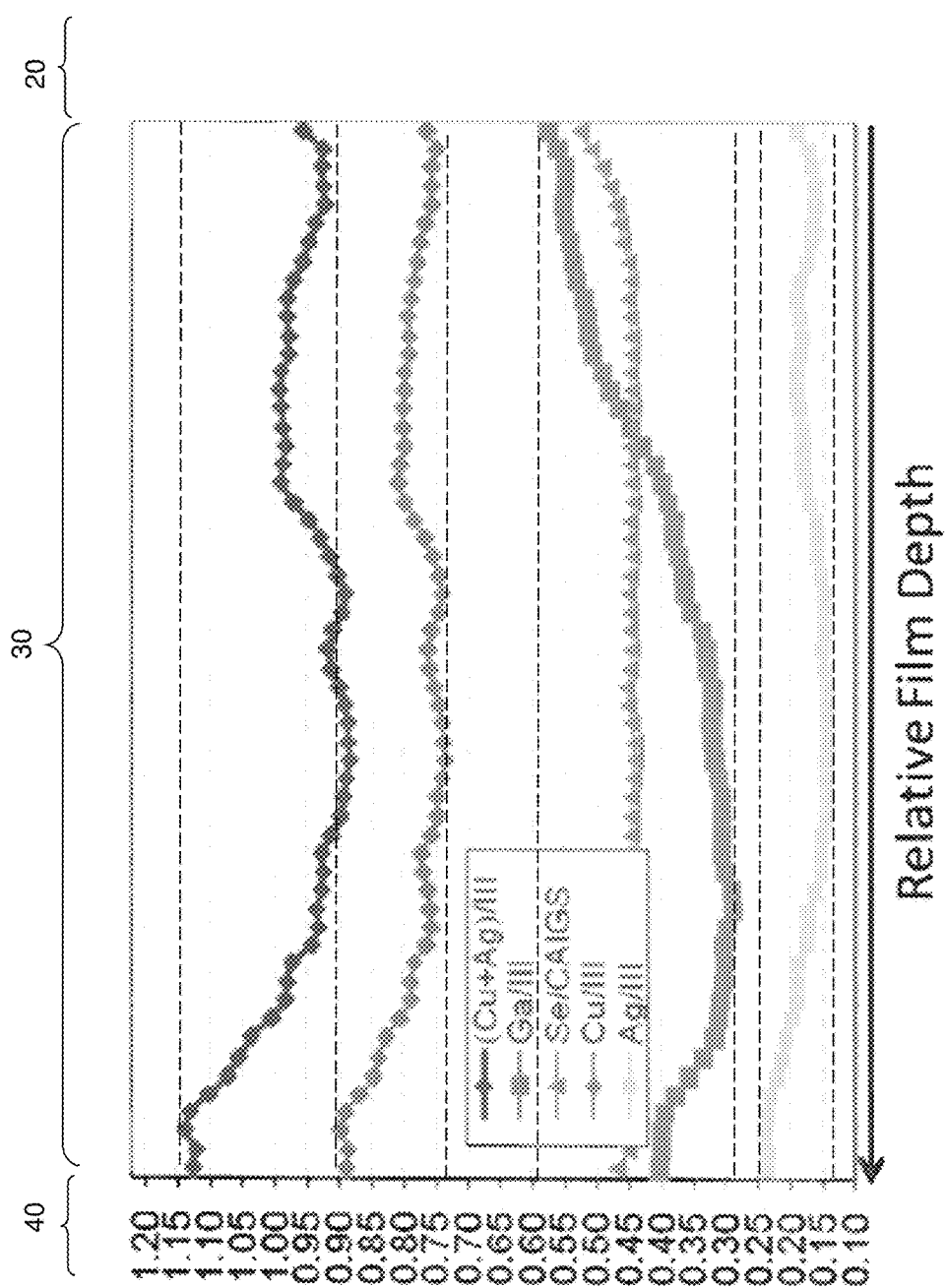
FIG. 5 is a schematic profile of atomic concentration of various elements in a completed absorber layer of an exemplary photovoltaic cell according to an embodiment of the present disclosure.

FIG. 5 schematically illustrates the atomic ratios of various components of the p-type semiconductor material layer 30 (e.g., the ACIGS film) as a function of film depth (i.e., thickness) in the completed photovoltaic cell. The location of the first electrode 20 is to the right of the plot and the location of the n-type semiconductor material layer 40 is to the left of the plot. Therefore, the film thickness is shown as extending from the bottom to the top from right to left in FIG. 5. The Se to ACIGS (also referred to as CAIGS) atomic ratio is relatively constant at around 0.45 except in the bottom of the film where it increases to slightly above 0.5.

The copper to Group III (i.e., In+Ga) atomic ratio is lower in the bottom and middle of the film (e.g., less than 0.85, such as 0.75 to 0.84) than in the top of the film (i.e., greater than 0.85, such as 0.86 to 0.9) in the thickness direction. Likewise, the silver to Group III (i.e., In+Ga) atomic ratio is lower in the bottom and middle of the film (e.g., less than 0.2, such as 0.15 to 0.19) than in the top of the film (i.e., greater than 0.2, such as 0.21 to 0.25) in the thickness direction. Therefore, the Group IB (i.e., Cu+Ag) to Group III (i.e., In+Ga) atomic ratio is lower in the bottom and middle of the film (e.g., less than 1.05, such as 0.9 to 0.1) than in the top of the film (i.e., greater than 1.05, such as 1.06 to 1.15) in the thickness direction. For example, the Group IB (i.e., Cu+Ag) to Group III (i.e., In+Ga) atomic ratio ranges from about 0.95 in the bottom of the film to about 0.9 in the middle of the film to about 1.15 in the top of the film.

In contrast, the gallium to Group III (i.e., In+Ga) atomic ratio is lower in the top and middle of the film (e.g., less than 0.5, such as 0.3 to 0.49) than in the bottom of the film (i.e., greater than 0.5, such as 0.51 to 0.59) in the thickness direction. Therefore, the top of the film is more copper and silver rich, while the bottom of the film is more gallium rich. Without wishing to be bound by a particular theory, this is believed to occur due to the addition of the silver which permits formation of the liquid phase which acts as a flux during deposition in the second zone 302 while the film is in the semi-solid state. This is believed to lead to an interdiffusion of various elements in the film during deposition.

Due to interdiffusion of atoms, the atomic concentration of various elements within the p-type compound semiconductor material layer 30 can have variations in composition along the direction of film growth. Most notably, the gallium concentration tends to gradually decrease from the side that is proximal to the first electrode 20 to the side that is distal from the first electrode 20 before slightly increasing at the top of the layer 30. Despite incorporation of silver atoms only from the at least one second sputtering target 314 in one embodiment, the silver atoms tend to diffuse throughout the p-type compound semiconductor material layer 30 by the end of the deposition process. Thus, it is possible to incorporate the amount of silver atoms that reduces the growth and partial melting temperature and thus enhances the grain size of the final p-type compound semiconductor material layer 30. In one embodiment, large average grain sizes in a range from 1 micron to 4 microns can be provided in the final p-type compound semiconductor material layer 30.

While the present disclosure is described employing an embodiment in which ACIG or CIG alloy targets are employed, embodiments are expressly contemplated herein in which each, or a subset, of the metal alloy targets is replaced with a pair of two sputtering targets (such as a silver-copper alloy target and an indium-gallium alloy target), or a set of three sputtering targets (such as a copper target, a silver target, and an indium-gallium alloy target), or a set of four sputtering targets (such as a copper target, a silver target, an indium target, and a gallium target).

Referring back to FIG. 2, the portion of the substrate 12 on which the first electrode 20 and the p-type compound semiconductor material layer 30 (e.g., the ACIGS absorber film 30) are deposited is subsequently passed into the third process module 400. An n-doped semiconductor material is deposited in the third process module 400 to form the n-doped semiconductor layer 40 illustrated in the photovoltaic cell 10 of FIG. 1. The third process module 400 can include, for example, an n-type semiconductor sputtering target 410 (which includes an n-type semiconductor target such as a CdS target) and a magnetron (not expressly shown). The n-type semiconductor sputtering target 410 can include, for example, a rotating AC magnetron, an RF magnetron, or a planar magnetron. A heater element 470 may be located in the module 400.

Subsequently, an n-type compound semiconductor material layer 40 is deposited over the p-type absorber layer 30 to form a p-n junction. The n-type compound semiconductor material layer 40 can include CdS, ZnS, ZnSe, or an alternative metal sulfide or a metal selenide. A material stack (30, 40) including a p-n junction is formed on the substrate 12. In one embodiment, the material stack (30, 40) can comprise a stack of a p-type metal chalcogenide semiconductor layer (as the p-type compound semiconductor material layer 30) and an n-doped metal chalcogenide semiconductor layer (as the n-doped semiconductor layer 40). In one embodiment, the p-type metal chalcogenide semiconductor layer can comprise copper indium gallium selenide (CIGS), and the n-doped metal chalcogenide semiconductor layer can comprise a material selected from a metal selenide, a metal sulfide (e.g., CdS), and an alloy thereof.

The portion of the substrate 12 on which the first electrode 20, the p-type compound semiconductor material layer 30, and the n-doped semiconductor layer 40 are deposited is subsequently passed into the fourth process module 500. A transparent conductive oxide material is deposited in the fourth process module 500 to form the second electrode comprising a transparent conductive layer 50 illustrated in the photovoltaic cell 10 of FIG. 1. The fourth process module 500 can include, for example, a conductive oxide sputtering target 510 and a magnetron (not expressly shown). The conductive oxide sputtering target 510 can include, for example, a ZnO, AZO or ITO target and a rotating AC magnetron, an RF magnetron, or a planar magnetron. A transparent conductive oxide layer 50 is deposited over the material stack (30, 40) including the p-n junction. In one embodiment, the transparent conductive oxide layer 50 can comprise a material selected from tin-doped indium oxide, aluminum-doped zinc oxide, and zinc oxide. In one embodiment, the transparent conductive oxide layer 50 can have a thickness in a range from 60 nm to 1,800 nm.

Subsequently, the web substrate 12 passes into the output module 800. The substrate 12 can be wound onto the output spool 810 (which may be a take up spool), or can be sliced into photovoltaic cells using a cutting apparatus (not shown).

A photovoltaic cell formed by the methods of the present disclosure can include a metal or metal alloy layer (which can be a first electrode 20) located on a substrate 12; a p-type compound semiconductor material layer 30 located on the metal layer 20 and comprising an alloy of silver, copper, indium, gallium, and at least one chalcogen (such as selenium)), wherein an atomic fraction of silver is in a range from 0.025 to 0.125; and an n-type compound semiconductor material layer 40 comprising a metal chalcogenide (such as CdS) and located on the p-type compound semiconductor material layer 30, and a second electrode 50 located on the n-type compound semiconductor material layer 40.

An exemplary photovoltaic cell of the present disclosure contains an ACIGS p-type compound semiconductor material layer 30 with an average atomic percentage of copper of 22%, average atomic percentage of silver of 4.9%, average atomic percentage of indium of 17.1%, average atomic percentage of gallium of 10.9%, and average atomic percentage of selenium of 45.1%. A comparative example photovoltaic cell contains a CIGS p-type compound semiconductor material layer 30 with no silver, average atomic percentage of copper of 26.9%, average atomic percentage of indium of 17.1%, average atomic percentage of gallium of 10.9%, and average atomic percentage of selenium of 45.1%. The atomic percentage of sodium is greater than zero and less than 0.1% in both samples.

The average grain size and deep defect density of the ACIGS p-type compound semiconductor material layer 30 of the exemplary photovoltaic cell are 1.37 microns and $6.1 \times 10^{15}$ cm$^3$, respectively, which is an improvement over the 1.08 micron average grain size and $3.1 \times 10^{16}$ cm$^3$ deep defect density of the CIGS p-type compound semiconductor material layer 30 of the comparative example photovoltaic cell. The average efficiency for the exemplary photovoltaic cell is about 16.68%, which is an improvement over the average efficiency of 16.36% for the comparative example photovoltaic cell. The average open circuit voltage for the exemplary photovoltaic cell is about 0.709 V which is an improvement over the average open circuit voltage of 0.697 V for the comparative photovoltaic cell. The average closed circuit current density for the exemplary photovoltaic cell is about 31.66 mA/cm$^2$ which is comparable to the average closed circuit current density of 31.90 mA/cm$^2$ for the comparative photovoltaic cell. The average fill factor for the exemplary photovoltaic cell is about 0.743, which is an improvement over the average fill factor of 0.735 for the comparative photovoltaic cell. In addition, the average deposition rate for the p-type compound semiconductor material layer 30 of the exemplary photovoltaic cell is more than twice the average deposition rate for the corresponding p-type compound semiconductor material layer for the reference photovoltaic cell. Thus, the methods of the present disclosure can provide less expensive fabrication methods while providing improved performance for photovoltaic cells.

It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the photovoltaic cells of the embodiments of the present disclosure.

What is claimed is:

1. A method of making a semiconductor structure comprising a compositionally graded silver, copper, indium, gallium chalcogenide film on a substrate, the method comprising sequentially performing:
   a first deposition process that deposits a first layer comprising copper, indium, gallium, and at least one chalcogen element on the substrate in a first sputtering zone;
   a second deposition process that deposits a second layer by sputtering silver, copper, indium, and gallium over the first layer in a first chalcogen-containing ambient in a second sputtering zone, wherein a combination of the first layer and the second layer comprises a first compositionally graded alloy layer of silver, copper, indium, gallium, and the at least one chalcogen element; and a third deposition process that deposits a third layer by reactively sputtering copper, indium, and gallium from a silver-free target over the second layer in a second chalcogen-containing ambient while inducing diffusion of silver atoms from the second layer into the third layer toward a growth surface in a third sputtering zone, wherein the compositionally graded silver, copper, indium, gallium chalcogenide film is formed on the substrate by an end of the third deposition process;

the first layer is in a solid state in the first sputtering zone;

the second layer is in a semi-solid state containing a liquid phase and a solid phase in the second sputtering zone;

reactively sputtering the copper indium gallium selenide over the second layer during the third deposition process recrystallizes the second layer to convert the second layer into a solid layer;

the second deposition process is performed while the substrate is at an elevated temperature in a range from 550 degrees Celsius to 900 degrees Celsius;

the second layer is deposited at a deposition rate in a range from 200 nm per minute to 1 micron per minute;

the compositionally graded silver, copper, indium, gallium chalcogenide film is deposited as a polycrystalline material having an average grain size in a range from 1 micron to 4 microns;

a ratio of a total flux of copper atoms that impinge on the substrate to a total flux of indium atoms and gallium atoms that impinge on the substrate in the first sputtering zone is in a range from 0.5 to 1;

a ratio of a total flux of gallium atoms that impinge on the substrate to the total flux of indium atoms and gallium atoms that impinge on the substrate in the first sputtering zone is in a range from 0.5 to 0.9;

a ratio of a total flux of silver atoms that impinge on the substrate to a total flux of silver atoms and copper atoms that impinge on the substrate in the second sputtering zone is in a range from 0.05 to 0.5;

a ratio of the total flux of silver atoms and copper atoms that impinge on the substrate to a total flux of indium atoms and gallium atoms that impinge on the substrate in the second sputtering zone is in a range from 0.98 to 1.15;

a ratio of a total flux of gallium atoms that impinge on the substrate to the total flux of indium atoms and gallium atoms that impinge on the substrate in the second sputtering zone is in a range from 0.2 to 0.5;

a ratio of a total flux of copper atoms that impinge on the substrate to a total flux of indium atoms and gallium atoms that impinge on the substrate in the third sputtering zone is in a range from 0.1 to 0.97; and a ratio of a total flux of gallium atoms that impinge on the substrate to the total flux of indium atoms and gallium atoms that impinge on the substrate in the third sputtering zone is in a range from 0.2 to 0.6.

2. The method of claim 1, wherein each of the first chalcogen-containing ambient and the second chalcogen-containing ambient comprises a selenium-containing ambient and the compositionally graded silver, copper, indium, gallium chalcogenide film comprises a compositionally graded silver copper indium gallium selenide (ACIGS) layer.

3. The method of claim 2, wherein the first deposition process reactively sputters a copper indium gallium selenide (CIGS) layer as the first layer over the substrate in the first sputtering zone using at least one first copper indium gallium target in a selenium containing ambient.

4. The method of claim 3, wherein the second deposition process reactively sputters silver, copper, indium, and gallium over the first layer to form the second layer in the second sputtering zone using at least one second silver copper indium gallium target in a selenium containing ambient.

5. The method of claim 4, wherein the at least one first copper indium gallium target located in the first sputtering zone is silver free.

6. The method of claim 4, wherein the third deposition process reactively sputters copper indium gallium selenide over the second layer in the third sputtering zone using one or more silver free copper indium gallium targets as the silver free target in a selenium containing ambient.

7. The method of claim 6, wherein the first, second and third sputtering zones are located in an enclosed chamber, and the substrate is continuously fed into the enclosed chamber and is continuously extracted out of the enclosed chamber.

8. The method of claim 7, wherein:

the liquid phase permeates as a wave through grain boundaries of solid portions of the second layer and coalesces smaller grains into larger grains while reducing a number of lattice defects during the second deposition process; and reactively sputtering the copper indium gallium selenide during the third deposition process comprises sputtering copper indium gallium selenide having a lower copper to Group III atomic ratio than that of the second layer as provided by the second deposition process to solidify liquid phase portions in the second layer as provided by the second deposition process during the third deposition process.

9. The method of claim 2, wherein the compositionally graded silver, copper, indium, gallium chalcogenide film comprises a p-type semiconductor absorber layer of a photovoltaic cell.

10. The method of claim 9, further comprising:

depositing a first electrode on the substrate prior to depositing the compositionally graded silver, copper, indium, gallium chalcogenide film;

depositing an n-type semiconductor material layer on the compositionally graded silver, copper, indium, gallium chalcogenide film; and depositing a second electrode on the n-type semiconductor material layer to form the photovoltaic cell.

11. The method of claim 9, wherein a copper plus silver to Group III atomic ratio is lower in a bottom portion and in a middle portion of the compositionally graded silver, copper, indium, gallium chalcogenide film than in a top portion of the compositionally graded silver, copper, indium, gallium chalcogenide film.

* * * * *